United States Patent
Hartmann et al.

(10) Patent No.: US 6,756,699 B2
(45) Date of Patent: Jun. 29, 2004

(54) DEVICE AND METHOD FOR CALIBRATING THE PULSE DURATION OF A SIGNAL SOURCE

(75) Inventors: Udo Hartmann, München (DE); Gunnar Krause, München (DE)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 10/186,596

(22) Filed: Jul. 1, 2002

(65) Prior Publication Data

US 2003/0016064 A1 Jan. 23, 2003

(30) Foreign Application Priority Data

Jun. 29, 2001  (DE) ......................................... 101 31 635

(51) Int. Cl.[7] ............................................... H03G 1/30
(52) U.S. Cl. ...................... 307/106; 330/284; 330/136
(58) Field of Search ......................... 307/106; 330/284, 330/136

(56) References Cited

U.S. PATENT DOCUMENTS

| | | | |
|---|---|---|---|
| 4,521,694 A | | 6/1985 | Ryczek et al. ............... 307/266 |
| 5,327,101 A | * | 7/1994 | Neely et al. ................. 330/284 |
| 5,838,073 A | * | 11/1998 | Khosrowpour et al. ........ 307/2 |
| 6,060,922 A | | 5/2000 | Chow et al. |
| 6,600,328 B2 | * | 7/2003 | Ku .............................. 324/678 |

FOREIGN PATENT DOCUMENTS

| | | |
|---|---|---|
| DE | 40 04 661 A1 | 9/1991 |
| DE | 198 22 374 A1 | 8/1999 |
| DE | 199 31 879 A1 | 1/2001 |
| WO | WO 84/02621 | 7/1984 |

\* cited by examiner

Primary Examiner—Bao Q. Vu
(74) Attorney, Agent, or Firm—Laurence A. Greenber; Werner H. Stemer; Ralph E. Locher

(57) ABSTRACT

An apparatus for calibrating the pulse duration of an output signal of a signal source may be used, in particular, for measuring and setting a duty cycle of a signal output from the signal source. The apparatus includes a comparator having a first input, a second input and an output. A reference voltage supply is provided, which is connected to the first input of the comparator. A charge storing capacitor, the charge state of which is adjustable as a function of the pulse duration of the output signal of the signal source, is connected to the second input of the comparator. Finally, the apparatus includes a processor for setting the pulse duration as a function of the comparison signal output at the output of the comparator. The apparatus for signal calibration allows an on-chip calibration and renders complicated external calibration systems superfluous.

20 Claims, 2 Drawing Sheets

1st MEASUREMENT

2nd MEASUREMENT

3rd MEASUREMENT

DEVICE AND METHOD FOR CALIBRATING THE PULSE DURATION OF A SIGNAL SOURCE

FIELD OF THE INVENTION

The present invention relates to devices and methods for calibrating the pulse duration of a signal source, i.e. for calibrating the temporal wave form of an output signal of a signal source. In particular the present invention relates to such devices and methods that may be used in an on-chip calibration and allow, for example, measuring and adjusting a duty cycle of the output signal of a signal source.

BACKGROUND OF THE INVENTION AND PRIOR ART

In order to calibrate the temporal wave form of an output signal of an integrated circuit, an external measurement/test system has been used in the prior art. In particular with wave forms having, in temporal terms, short signal cycles, calibration of such a wave form requires an external measurement/test system with high accuracy. Such a measurement/test system, however, is costly, it requires space, and a very high process-related expense is required for connecting the integrated signal sources to the measurement/test system.

SUMMARY OF THE INVENTION

It is therefore the object of the present invention to provide a device and a method by which signal calibration of a signal source may be carried out at a minimum process and device-related expense.

The present invention provides a device for calibrating the pulse duration of the output signal of a signal source, comprising:

voltage comparison means having a first input, a second input and an output;
means for providing a reference voltage connected to the first input of the voltage comparison means;
charge storing means, the charge state of which is adjustable as a function of the pulse duration of a pulse of the signal source, the charge storing means being connected to the second input of the voltage comparison means; and
processing means for adjusting the pulse duration as a function of the reference signal output at the output of the voltage comparison means.

The present invention further provides a method of calibrating the pulse duration of an output signal of a signal source, comprising:

providing a reference voltage having a pre-determined level;
adjusting the charge state of a charge storing means as a function of the pulse duration of a pulse from the signal source;
comparing the reference voltage with a voltage dependent on the charge state of the charge storing means; and
adjusting the pulse duration as a function of the comparison of the reference voltage with the voltage dependent on the charge state of the charge storing means.

The present invention thus makes it possible to convert a time period, i.e. the pulse duration of the pulse output from the signal source, by means of the charge storing means, which is designed, for example, as a capacitor, into a voltage value so as to subsequently compare this voltage value with a pre-determined reference voltage. The result of the comparison will then allow to draw conclusions as to whether the pulse duration of the pulse being set is too low or too high and must therefore be set to a higher or a lower value. By converting a time period into a voltage value, the inventive method allows the use of simple electronic components and renders the use of expensive, complicated time measurement devices superfluous.

While in the simplest case the charge state of the charge storing means is set or changed only as a function of the pulse duration of a pulse, it is also possible in accordance with an advantageous embodiment of the invention to set the charge state of the charge storing means as a function of a signal cycle consisting of the pulse and the pulse intermediary period intervening before the occurrence of a next pulse. In such a case, for example, charges are applied to the charge storing means during a pulse of the signal cycle, while charges are taken from the charge storing means during the pulse intermediary period. If there is a desired duty cycle, i.e., a ratio of pulse duration and pulse intermediary period, of, for example, 1:1, there is thus a net charge change during a signal cycle of zero. In such a case the pulse duration need not be set. However, if net charging or net discharging of the charge storing means arises due to a deviation from a desired duty ratio, a corresponding counteracting setting of the pulse duration of the signal source becomes necessary, which represents a calibration of same.

In accordance with the invention, a plurality of signal cycles of the output signal of the signal source are passed before a comparison with the reference voltage is carried out and before the pulse duration is set, so as to effect a summing up of the net charge change effected in each signal cycle and to compare a voltage dependent on these summed-up net charge changes with the reference voltage. This enables the reliable detection of even very small deviations from a desired duty cycle. In preparation the charge storing means is preferably biased to a pre-determined charge state.

In the process, the comparison of the voltage based on the summed-up net charge change with the reference voltage can be effected after a pre-determined number of cycles or after a pre-determined time period. The number of cycles or the time period used is selected to be sufficiently large to ensure that the system will have reached a steady state thereafter.

As a function of the result of the comparison carried out after one or a plurality of signal cycles, the pulse duration of the pulse of the signal source is either decreased or increased so as to achieve an approximation to the desired pulse duration and/or a desired duty cycle. This procedure is preferably repeated several times so as to obtain an iterative approximation to the desired result. To this end, the control quantity by which the pulse duration is increased or decreased is reduced, for example halved, with each repetition. Doing this, the method is repeated as many times as are needed to achieve the desired value, i.e. the target value, with the desired accuracy.

In accordance with advantageous embodiments of the present device, the comparison means has a comparator, and the charge storing means has a capacitor.

In accordance with a further advantageous embodiment of the invention the charge storing means has a capacitor, one electrode of which is connected to a biasing means, and the other electrode of which is connected to the output of the signal source via a resistor. The connection point between the capacitor and the resistor is connected to the second input of the voltage comparison means.

The charge state of the charge storing means may be set using a constant current source instead of the above-mentioned RC member for temporal integration of a voltage. In this case the output signal of the signal source is compared to a further reference voltage, wherein, when the output signal exceeds a pre-determined level, i.e. during the pulse duration, loading of the charge storing means by the constant current source is effected. If the output signal falls short of the further reference voltage, i.e. during a pulse intermediary duration, the charge storing means is discharged via the constant current source.

The use of the controlled constant current source allows charging or discharging of the capacitor with a linear characteristic, in contrast with the characteristic in the form of an exponential function (e-function), when the capacitor is charged or discharged directly via a resistor through the pulse of the signal source to be calibrated.

In accordance with further advantageous embodiments of the invention an attenuator in the form of a low-pass is connected between the charge storing means and the voltage comparison means, which attenuator has a resistor and a capacitor, for example.

The respective reference voltages may be provided directly by a connection to corresponding voltage sources of the inventive device. In accordance with the invention, however, preferably corresponding voltage divider circuits are used which allow to obtain the required voltages from the voltages existing on an chip in the usual manner. Thus the inventive calibration device may be integrated in an on-chip manner without any substantial device-related expense.

In accordance with the invention no external measurement/test system is thus required for calibrating the pulse duration of a signal source. In accordance with the invention the cost as well as the space requirement that would be associated with such an external measurement/test system may be saved. After all the present invention enables constant re-calibration of signal sources arranged on a chip if the calibration means is integrated on the chip, which is readily possible due to the structure of same in terms of circuitry.

BRIEF DESCRIPTION OF THE DRAWINGS

In the following the present invention will be explained in more detail with reference to the accompanying drawings, wherein.

DETAILED DESCRIPTION OF THE PREFERRED EMBODIMENT

Figure 1:
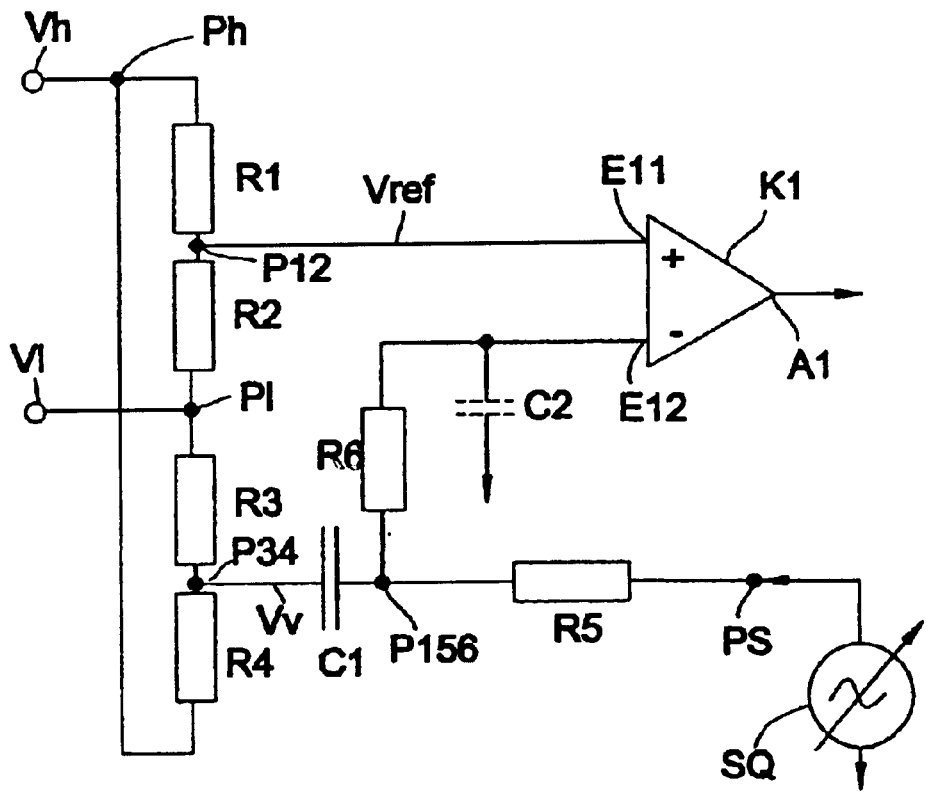
FIG. 1 shows a circuit diagram of a device for calibrating a signal source in accordance with a first embodiment of the present invention.

With reference to the circuit diagram of FIG. 1 a first embodiment of the inventive device for calibrating the pulse duration of a signal source SQ will be described.

The calibration device includes a comparator K1, a capacitor C1, a voltage divider formed by four resistors R1 to R4, a resistor R5 and an attenuator comprising a resistor R6 and a capacitor C2.

An output PS of the signal source SQ is connected to a terminal of the resistor R5, whereas the other terminal of the resistor R5 is connected to an electrode of the capacitor C1 serving as the charge storing means. A connection point P156 between the capacitor C1 and the resistor R5 is further connected to a first terminal of the resistor R6. The second terminal of the resistor R6 is connected to a second input E12 of the comparator K1 and to ground via the capacitor C2 of the attenuator. The other electrode of the capacitor C1 is connected to a biasing point P34 formed by a second output of the voltage divider formed by the four resistors. A first output P12 of the voltage divider is connected to a first input E11 of the comparator K1. A potential Vref is applied to the first input of the comparator K1 via the output P12 of the voltage divider, whereas a biasing potential Vv is applied to an electrode of the capacitor C1 via the output P34. An output signal, the level of which depends on the result of the comparison of the voltages input into the comparator at the inputs E11 and E12, exists at an output A1 of the comparator.

The voltage divider is formed by the four resistors R1, R2, R3 and R4, same being serially connected in a closed loop. The first output P12 of the voltage divider is located between the resistors R1 and R2, whereas the second output is located between the resistors R3 and R4. A first input Ph of the voltage divider, to which a first potential Vh is applied, is located between the resistors R1 and R4. A second input Pl of the voltage divider, to which a second potential Vl is applied, is located between the resistors R2 and R3 of the voltage divider.

The resistors R1 to R4 are dimensioned such that the voltage Vref establishes itself at the point P12, and the voltage Vv establishes itself at the point P34, from the potentials Vh and Vl. In the embodiment shown the potential Vh has a high level, whereas the potential Vl has a low level. The resistors R1 and R2 are preferably high-impedance resistors, with a resistance in the range of, for example, 1 Mohm so as to keep any power loss due to shunt currents through these resistors as low as possible. In the embodiment described the resistors R3 and R4 are low-impedance resistors, the resistance of which is in the range of 50 ohm, for example. In the embodiment shown the relationship of the resistors R1 and R2 is equal to the relationship of the resistors R3 and R4, so that identical voltages exist at the points P12 and P34.

The resistor R5 and the capacitor C1 are dimensioned such that the time constant defined by same allows charging and/or discharging of the capacitor C1 at the pulse durations occurring.

In the following the mode of operation of the above-described circuit will be explained in more detail with further reference to FIGS. 3a to 3c.

The signal source SQ, the output PS of which is connected to the resistor R5, creates a pulsed output signal, it being assumed in the following description that it is the aim of the calibration to achieve a duty cycle of 1:1 for this output signal. The output signal of the signal source SA is said to have a high signal level Vhs during the pulse duration and a low signal level Vls between pulses, i.e. during the intermediary pulse duration. The output signal is further said to have a fixed period TG defined by the pulse duration and the intermediary pulse duration.

On account of the voltage divider described the voltage Vref is applied to the first input E11 of the comparator K1. Further the voltage Vv, which is equal to Vref in the embodiment shown, is applied to the point P34.

The voltage Vv biases the capacitor to a pre-determined charge state. Here the voltage Vv is selected such that it is between the high signal level Vhs and the low signal level Vls of the signal source, so that charging of the capacitor is effected during the pulse duration, and discharging of same is effected during the intermediary pulse duration.

Figure 3A:
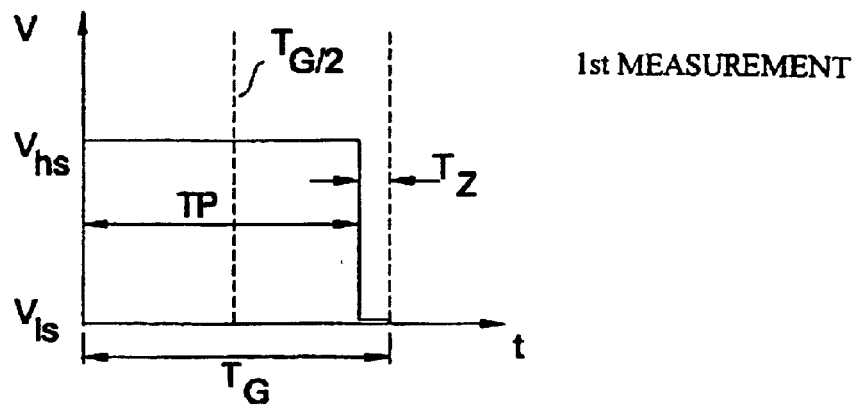
FIGS. 3a to 3c show schematic representations for illustrating the setting of a 1:1 duty cycle using the inventive method.
Figure 3B:
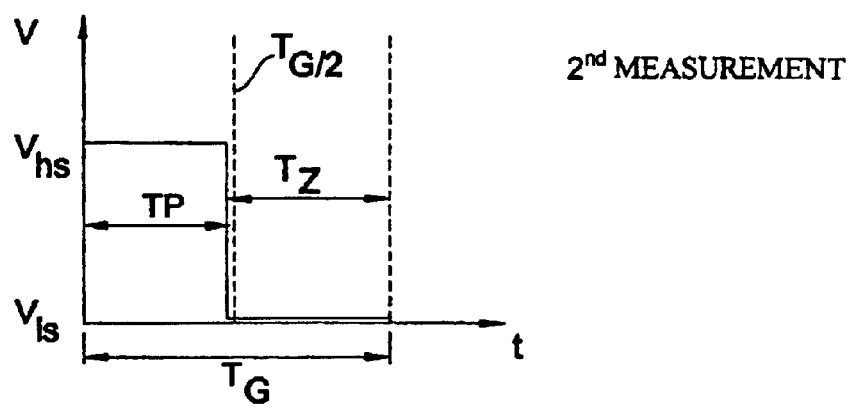
Figure 3C:
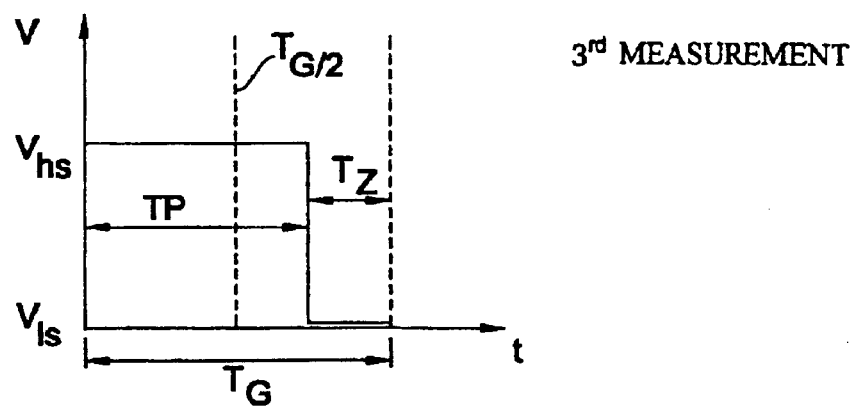

An exemplary output signal of the signal source SQ is shown in FIG. 3a, which signal has a period TG. The pulse duration is TP, whereas the intermediary pulse duration is TZ. A pulse of the duration TP and an intermediary pulse duration TZ together form a period that may also be referred to as a signal cycle. In the wave form represented in FIG. 3a the pulse duration TP clearly is longer than the intermediary pulse duration TZ. For a duty cycle of 1:1 the pulse duration would have to be TG/2, as is indicated schematically in FIG. 3a.

Due to the disproportion between the pulse duration and the intermediary pulse duration, as is shown in FIG. 3a, a net charging of the capacitor C1 results for each signal cycle of the output signal of the signal source SQ. This net charging leads to an increase in the voltage applied to the input E12 of the comparator K1, so that the voltage applied to the input E12 exceeds the voltage Vref. Thus the comparator K1 produces an output signal A1 having a first signal level. In the initial example shown the output signal A1 of the comparator in this case adopts a low signal level.

The attenuator formed by the resistor R6 and the capacitor C2 here serves to keep voltage changes, produced by the charging and discharging of the capacitor C1 due to the individual pulses, away from the input E12 of the comparator K1 so as to prevent constant toggling of the comparator. Alternatively, the comparator may itself demonstrate a sufficiently slow response behavior so as to supply by itself the low-pass effect described.

The detection of the output signal is effected only after a pre-determined number of signal cycles, which number ensures that the system is in a steady state. Only then is it ensured that the output signal A1 of the comparator K1 is caused only by the net charge changes due to the duty cycle.

The level of the output signal A1 of the comparator K1 thus indicates whether the pulse duration is too short or too long for a desired duty cycle.

As a function of the output signal A1 of the comparator K1, calibration of the pulse duration of the signal source SQ can thus be effected, for example by carrying out an iterative approximation. To this end the pulse duration may be reset after each measurement as follows, before a new measurement is carried out:

$$TP = TP0 + \sum_{i=1}^{n} (\pm) \frac{TP0}{i*2}$$

wherein TP0 is the initial pulse duration and I is the execution index for the number of measurements carried out. The expression (±) is to indicate that the term $$\frac{TP0}{i*2}$$

is added if the previous measurement has shown that the pulse duration was too short, while it is subtracted if the previous measurement has shown that the pulse duration was too long.

For the wave form shown in FIG. 3a the output signal A1 of the comparator K1 indicated that the pulse duration of the signal source was too long. For the purpose of the iterative approximation mentioned above the value TP/2 is thus subtracted from the original pulse duration. The resulting wave form is shown in FIG. 3b. Since the duty cycle in this wave form is smaller than 1:1, a net discharge of the capacitor C1 is effected in each signal cycle. Again after a sufficient number of cycles for ensuring a steady-state system, a voltage smaller than Vref is applied to the input E12 of the comparator K1, so that an output signal having a second signal level, which is a high signal level in the embodiment shown, is applied to the output A1 of the comparator K1.

Due to this high signal level at the output of the comparator the control now causes a prolongation by TP/2 of the pulse duration TP used in the previous measurement. Based on a starting value, the pulse duration thus is as follows: $T_{start}$; $T_{new} = T_{start} - T_{start}/2 + T_{start}/4$. The resulting wave form is represented in FIG. 3c.

The method described above may be continued until the desired target value, in the present case a duty cycle of 1:1, has been reached with the desired accuracy. Such a level of accuracy might be, for example, a resolution of starting value/256.

In the above example, measurements have been carried out after a pre-determined number of cycles, respectively. Alternatively, measurements may also be carried out after a pre-determined period of time has elapsed.

It should further be noted that any duty cycles desired may be set and/or calibrated given an appropriate choice of the reference voltage Vref, i.e. by an appropriate choice of the resistors R1 to R4, by an appropriate choice of the capacitor C1 and of the resistor R5, as well as by corresponding matching of the number N of passes of the signal cycles during a measurement step.

In the following a second embodiment of an inventive calibration device shall additionally be described with reference to FIG. 2. This embodiment differs from that described with reference to FIG. 1 only with regard to the circuitry between the capacitor C1 and the signal source SQ.

Figure 2:
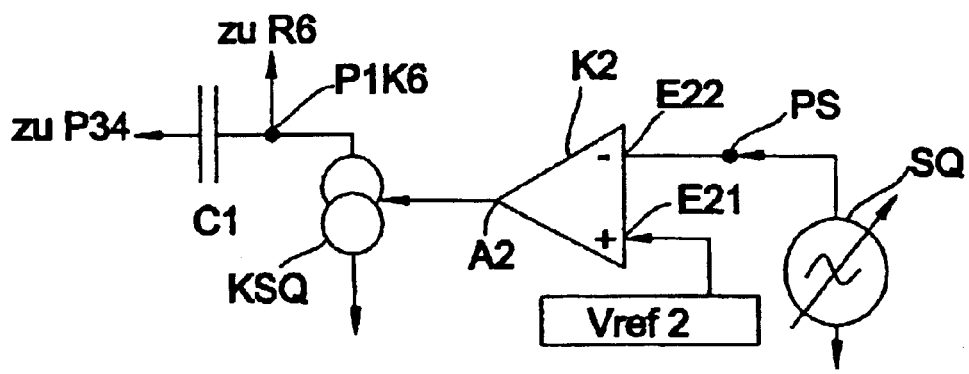
FIG. 2 shows a circuit diagram of a charge storing means connected to a signal source to be calibrated in accordance with a second embodiment of the present invention.

In the embodiment shown in FIG. 2 the output PS of the signal source SQ is connected to an input E22 of a second comparator K2, the other input E21 of which is on a reference potential Vref2. The output A2 of the comparator K2 is connected to a constant current source (KSQ) which is further coupled to an electrode of the capacitor C1. As is indicated in FIG. 2, the connection point between the capacitor C1 and the constant current source KSQ, i.e. the point P1K6, is connected to the resistor R6, whereas the other electrode of the capacitor C1 is connected to the point P34.

The reference potential Vref2 is selected such that it is ensured that the comparator K2 outputs different output signals for both signal levels of the output signal of the signal source. For example, the potential Vref2 may be set to a value of (Vhs−Vhl)/2.

The constant current source is driven by the output signal A2 of the comparator K2 such that the capacitor C1 is charged by the constant current source during the pulse duration TP of the output signal of the signal source SQ, and that the capacitor C1 is discharged by the constant current source during the pulse intermediary duration TZ. Thus the replacement of the resistor, which supplies the capacitor in the first embodiment, by a constant current source and a comparator allows a linear voltage rise/drop at the capacitor due to the current applied by the constant current source, the constant current source supplying positive or negative currents in equal amounts to the capacitor as a function of the comparator signal. If duty cycles other than 1:1 are to be set, the amounts of the currents of different signs which are supplied by the constant current source may differ correspondingly, wherein the discharge current may be, for example, double the amount of the charge current if a duty cycle of 2:1 between the pulse duration and the pulse intermediary duration is to be set.

Besides, a calibration which is similar to that of the first embodiment may be carried out with the second embodiment using an iterative approximation.

If the resistors R1 to R4 and the capacitor C1 are manufactured in a sufficiently precise manner, the present invention also allows determining arbitrary duty cycles with a corresponding accuracy by setting corresponding voltage ratios.

For realizing the present invention with regard to a signal source to be calibrated and having a frequency of 200 MHz, the resistor R5 may have a value of 2 kΩ, the resistor R6 may have a value of 5 kΩ, and the capacitors C1 and C2 may have a value of 10 pF, respectively. With the values indicated, a stabilization time of about 400 ns to 500 ns is required following a change in the duty cycle, until the output signal of the comparator is evaluated.

The voltages Vh, Vl, Vhs, Vhl and Vref2 used in the inventive devices and methods may be obtained in a simple manner from the voltages applied to a chip, wherein the voltages Vh and Vhs on the one hand, and Vl and Vls on the other hand may preferably be identical. Thus the inventive devices are to be readily integrated onto a circuit chip.

The present invention thus provides devices and methods allowing on-chip calibration using a duty cycle measurement and/or time measurement. In accordance with an embodiment an RC member is used for temporal integration of a voltage, the duty cycle of the signal source to be calibrated is converted into a voltage value using a self-generated reference voltage. On this basis, an iterative approximation to a target value for the duty cycle is effected.

Thus the present invention allows simple determination of the duty cycle since only the ratio of the resistors must be accurate. Further the invention allows concrete determination of time values on the pre-condition that the resistors and the capacitor are manufactured in a precise manner. The inventive devices may be implemented as being integrated on a chip or externally in a calibration device.

What is claimed is:

1. Device for calibrating the pulse duration (TP) of the output signal of a signal source (SQ), comprising:
   voltage comparison means having a first input, a second input and an output;
   means for providing a reference voltage connected to the first input of the voltage comparison means;
   charge storing means, the charge state of which is adjustable as a function of the pulse duration of a pulse of the signal source, the charge storing means being connected to the second input of the voltage comparison means; and
   processing means for adjusting the pulse duration as a function of the reference signal output at the output of the voltage comparison means.

2. Device as claimed in claim 1, wherein the voltage comparison means comprises a comparator.

3. Device as claimed in claim 1, which further comprises means for biasing the charge storing means to a pre-determined charge state.

4. Device as claimed in claim 1, which further comprises a voltage divider circuit having a first input, where a first potential is applied, a second input, where a second potential is applied, a first output supplying the pre-determined reference voltage, and a second output supplying a biasing potential for the charge storing means.

5. Device as claimed in claim 4, wherein the voltage divider circuit comprises a first, a second, a third and a fourth resistor serially interconnected in a closed loop, the first input being located between the first and the fourth resistors, the second input being located between the second and the third resistors, the first output being located between the first and the second resistors, and the second output being located between the third and the fourth resistors.

6. Device as claimed in claim 1, wherein the charge storing means comprises a capacitor.

7. Device as claimed in claim 6, wherein a resistor is connected between the capacitor and an output of the signal source.

8. Device as claimed in claim 7, wherein the second input of the voltage comparison means is connected to a connection point between the capacitor and the resistor.

9. Device as claimed in claim 1, which comprises the following circuit arrangement between the charge storing means and an output of the signal source:
   second voltage comparison means having a first input, a second input and an output, the first input being connected to second means for providing a reference voltage, and the second input being connected to the output of the signal source; and
   a constant current source which is connected to the output of the second voltage comparison means and is controlled as a function of the output signal output at the output of the second voltage comparison means,
   an output of the constant current source being connected to the capacitor.

10. Device as claimed in claim 1, wherein an attenuator is connected between the charge storing means and the voltage comparison means.

11. Device as claimed in claim 10, wherein the attenuator comprises a resistor and a capacitor.

12. Method of calibrating the pulse duration of an output signal of a signal source, comprising:
   a) providing a reference voltage having a pre determined level;
   b) adjusting the charge state of a charge storing means as a function of the pulse duration of a pulse from the signal source;
   c) comparing the reference voltage with a voltage dependent on the charge state of the charge storing means; and
   d) adjusting the pulse duration as a function of the comparison of the reference voltage with the voltage dependent on the charge state of the charge storing means.

13. Method as claimed in claim 12, which further comprises a step of biasing the charge storing means to a pre-determined charge state.

14. Method as claimed in claim 12, wherein the signal of the signal source has a signal cycle comprised of the pulse and a pulse intermediary time, wherein in step b) of setting the charge state, the charge state of the charge storing means establishes itself as a function of the ratio of pulse duration and pulse intermediary duration of a signal cycle.

15. Method as claimed in claim 14, wherein in step b) of setting the charge state, the charge state of the charge storing means is set during the passing through of a plurality of signal cycles.

16. Method as claimed in claim 15, wherein the steps c) of comparing and d) of setting the pulse duration are carried out after a pre-determined number of signal cycles.

17. Method as claimed in claim 15, wherein the steps c) of comparing and d) of setting the pulse duration are effected after a pre-determined time, after which a plurality of signal cycles have been carried out.

18. Method as claimed in claim 12, wherein the pulse duration is increased if the comparison in step c) demonstrates that the reference voltage is higher than the voltage dependent on the charge state of the charge storing means.

19. Method as claimed in claim 12, wherein the pulse duration is reduced if the comparison in step c) demonstrates that the reference voltage is smaller than the voltage dependent on the charge state of the charge storing means.

20. Method as claimed in claim 12, wherein the steps a) to d) are carried out several times, setting values which decrease with each time being used in step d) so as to determine the pulse duration by an iterative approximation.

* * * * *